(12) United States Patent
Strauss et al.

(10) Patent No.: US 9,008,138 B2
(45) Date of Patent: Apr. 14, 2015

(54) LASER DIODE DEVICE

(71) Applicant: OSRAM Opto Semiconductors GmbH, Regensburg (DE)

(72) Inventors: Uwe Strauss, Bad Abbach (DE); Soenke Tautz, Tegernheim (DE); Alfred Lell, Maxhuette-Haidhof (DE); Clemens Vierheilig, Tegerheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/859,446

(22) Filed: Apr. 9, 2013

(65) Prior Publication Data

US 2013/0272333 A1 Oct. 17, 2013

Related U.S. Application Data

(60) Provisional application No. 61/623,343, filed on Apr. 12, 2012.

(51) Int. Cl.
| | |
|---|---|
| *H01S 5/00* | (2006.01) |
| *H01S 5/022* | (2006.01) |
| *H01S 5/024* | (2006.01) |
| *H01S 5/028* | (2006.01) |
| *H01S 5/22* | (2006.01) |

(52) U.S. Cl.
CPC ......... *H01S 5/02236* (2013.01); *H01S 5/02268* (2013.01); *H01S 5/02272* (2013.01); *H01S 5/02469* (2013.01); *H01S 5/02461* (2013.01); *H01S 5/028* (2013.01); *H01S 5/22* (2013.01); *H01S 2301/176* (2013.01)

(58) Field of Classification Search
CPC ... H01S 5/0215; H01S 5/34333; H01S 5/022; H01S 5/0216; H01S 5/02208; H01S 5/02236; H01S 5/0224; H01S 5/02256; H01S 5/024
See application file for complete search history.

(56) References Cited

U.S. PATENT DOCUMENTS

| | | |
|---|---|---|
| 3,136,932 A | 6/1964 | Trent |
| 5,018,820 A | 5/1991 | Boudreau et al. |
| 5,198,686 A | 3/1993 | Yoshimura |
| 6,044,101 A | 3/2000 | Luft |

(Continued)

FOREIGN PATENT DOCUMENTS

| | | |
|---|---|---|
| CN | 201303205 Y | 9/2009 |
| CN | 102214894 A | 10/2011 |

(Continued)

OTHER PUBLICATIONS

Carcia, P.F., et al., "Gas diffusion ultrabarriers on polymer substrates using $Al_2O_3$ atomic layer deposition and SiN plasma-enhanced chemical vapor deposition," Journal of Applied Physics, No. 106, 2009, 6 pages.

(Continued)

*Primary Examiner* — Tuan Nguyen
(74) *Attorney, Agent, or Firm* — Slater & Matsil, L.L.P.

(57) ABSTRACT

A laser diode device is specified, comprising a housing having a mounting part and a laser diode chip based on a nitride compound semiconductor material in the housing on the mounting part, wherein the laser diode chip is mounted directly on the mounting part using a solder layer, and the solder layer has a thickness of greater than or equal to 3 μm.

21 Claims, 7 Drawing Sheets

(56) References Cited

U.S. PATENT DOCUMENTS

| | | |
|---|---|---|
| 6,323,059 B1 | 11/2001 | Yoshida et al. |
| 6,335,548 B1 | 1/2002 | Roberts et al. |
| 6,347,107 B1 | 2/2002 | Roddy et al. |
| 6,590,920 B1 | 7/2003 | McElhinney et al. |
| 2003/0067950 A1 | 4/2003 | Hanaoka |
| 2004/0196877 A1 | 10/2004 | Kawakami et al. |
| 2005/0074046 A1* | 4/2005 | Kasai ............................ 372/50 |
| 2007/0051968 A1 | 3/2007 | Yamamoto et al. |
| 2007/0215996 A1* | 9/2007 | Otremba ....................... 257/678 |
| 2008/0130698 A1* | 6/2008 | Bessho et al. .............. 372/45.01 |
| 2008/0237569 A1* | 10/2008 | Nago et al. ....................... 257/13 |
| 2008/0267238 A1 | 10/2008 | Takeuchi et al. |
| 2008/0317080 A1 | 12/2008 | Kameyama et al. |
| 2010/0124246 A1 | 5/2010 | Lutgen et al. |
| 2010/0303110 A1 | 12/2010 | Bhagavatula et al. |
| 2011/0057220 A1 | 3/2011 | Mochida et al. |
| 2011/0134948 A1 | 6/2011 | Kawakami et al. |
| 2012/0033698 A1 | 2/2012 | Morizumi |
| 2012/0057612 A1 | 3/2012 | Yoshida et al. |
| 2012/0326178 A1 | 12/2012 | Fehrer et al. |
| 2013/0343419 A1 | 12/2013 | Lell et al. |

FOREIGN PATENT DOCUMENTS

| | | |
|---|---|---|
| DE | 1184870 B | 1/1965 |
| DE | 102004052686 A1 | 3/2006 |
| DE | 102005041064 A1 | 3/2007 |
| DE | 10 2005 053 274 A1 | 4/2007 |
| DE | 102005058237 A1 | 4/2007 |
| DE | 102006017294 A1 | 7/2007 |
| JP | 2560131 B2 | 12/1996 |
| JP | 2001-135745 A | 5/2001 |
| JP | 2004-006824 A | 1/2004 |
| JP | 2005-019973 A | 1/2005 |
| JP | 2005-101073 A | 4/2005 |
| JP | 2006-135219 A | 5/2006 |
| JP | 2011-151080 A | 8/2011 |
| TW | 451535 B | 8/2001 |
| TW | 201221337 A | 6/2012 |
| WO | WO 2011/073027 A1 | 6/2011 |

OTHER PUBLICATIONS

Eichler, C., "Thermisches Management GaN-basierter Laserdioden," Cuvillier Verlag Göttingen, 2006, ISBN 3-86537-754-8, pp. 132-133 and 136-137.

Hirvikorpia, T., et al., "Enhanced water vapor barrier properties for biopolymer films by polyelectrolyte mulitlayer and atomic layer deposited $Al_2O_3$ double-coating," Applied Surface Science, vol. 257, 2011, pp. 9451-9454.

Johansson, P., "Atomic Layer Deposition Process for Barrier Applications of Flexible Packaging," downloaded from http://www.tappi.org/content/events/10PLACE/pagpes/johansson.pdf, Apr. 18-21, 2010, 21 pages.

Lutgen, S., et al., "Recent results of blue and green InGaN laser diodes for laser projection," Proc. SPIE, vol. 7953, 2011, pp. 79530G1-79530G12.

Ritala, M., et al., "Atomic layer deposition," Handbook of Thin Film Materials, vol. 1: Deposition and Processing of Thin Films, Academic Press, 2002, ISBN 0-12-512909-2/535.00, pp. 103-159.

Sizov, D., et al., "Gallium Indium Nitride-Based Green Lasers," IEEE Journal of Lightwave Technology, vol. 30, No. 5, Mar. 1, 2012, pp. 679-699.

Sizov, D., et al., "Carrier Transport in InGaN MQWs of Aquamarine- and Green-Laser Diodes," IEEE Journal of Selected Topics in Quantum Electronics, vol. 17, No. 5, Sep./Oct. 2011, pp. 1390-1401.

Strauss, U., et al., "Pros and cons of green InGaN laser on c-plane GaN," Phys. Status Solidi B, vol. 248, 2010, pp. 652-657.

Vierheilig, C., et al., "Beyond blue pico laser: development of high power blue and low power direct green," Proc. SPIE, vol. 8277, Novel In-Plane Semiconductor Lasers XI, Feb. 9, 2012, pp. 82770K-1-82770K-7.

* cited by examiner

LASER DIODE DEVICE

This application claims the benefit of U.S. Provisional Application No. 61/623,343, filed on Apr. 12, 2012, which application is hereby incorporated herein by reference.

TECHNICAL FIELD

A laser diode device is specified.

BACKGROUND

Light sources having a high optical power density are key components for a multiplicity of applications. By way of example, laser diodes composed of a nitride-based compound semiconductor material system have a high market potential for projection systems, in particular those having luminous fluxes of between 1,000 and 20,000 lumens.

Therefore, components having high output powers and compact housings are required for such applications. For cost reasons, and in the context of standardization, housings of the so-called TO type series (TO: "transistor outline") in the form of TO metal housings ("TO metal can") are customary, for instance in the form of the known structural sizes TO38, TO56 and TO90, wherein the TO metal housings are substantially manufactured from steel. Such standard TO designs, also designated hereinafter as "TO housings" for short, are usually used nowadays for laser diodes. However, currently available laser diodes in TO housings have been limited so far to optical powers of less than 3 watts, which is insufficient for many applications. To date, however, it has not yet been possible to achieve optical powers of above 3 watts with such designs.

By way of example, C. Vierheilig, et al., Proc. SPIE, vol. 8277, 82770K, 2012, discloses blue-emitting nitride-based laser diodes in TO housings which, at room temperature in continuous wave operation, can emit light having a wavelength in the range of 440 nm to 460 nm with an output power of a maximum of 2.5 watts.

In the case of such laser diodes, the TO housings have thermal inadequacies, in particular during mounting, which is customary for technical reasons, with that side of the substrate which faces away from the semiconductor layer sequence on a heat sink between a housing and a laser diode, such that the semiconductor layer sequence is arranged at the top as seen from the housing ("Epi up").

Alongside the standard TO housings composed of high-grade steel, TO housings are also known which, for better heat dissipation, have a base that is based on copper or has a copper core and a steel surface. However, studies have been able to show that the use of such modified TO housings alone does not lead to an increase in the output power of laser diodes.

In the case of red and infrared power laser diodes, in particular on the basis of arsenides, thermally optimized mounting concepts with very direct heat dissipation are known, in particular mounting with that side of the semiconductor layer sequence which is situated opposite the substrate downward ("Epi down") on a heat sink between the laser diode and a housing and furthermore the use of a copper carrier instead of a TO housing.

However, such measures are unsuitable for nitride-based laser diodes since a cost-effective capping for protecting the laser against contamination and mechanical damage is not possible for a copper carrier. Particularly, for example, in the case of use in the automotive sector, moisture and chemicals can be critical and may necessitate a hermetic capping in order to protect the laser diodes from such external influences. Since, in the case of nitride-based laser diodes, the p-side is typically arranged on that side of the active region which faces away from the substrate, and is made as thin as possible since the operating voltage can increase with increasing thickness of a p-doped nitride-based semiconductor layer. Therefore, "Epi down" mounting of nitride-based laser diodes can easily lead to short circuits and thus to a reduction of the yield. This is because the active region is situated very near the ? contact in the case of nitride based laser diodes.

SUMMARY OF THE INVENTION

At least one embodiment of the present invention describes a laser diode device.

In accordance with at least one embodiment, a laser diode device comprises a housing, in which a laser diode chip is arranged on the mounting part by means of a solder layer.

The housing can preferably be mountable with an outer area on an external heat sink, for example, a cooling body or a printed circuit board. At least the mounting part and preferably all regions of the housing which are situated between the laser diode chip and the outer area which is provided for mounting the laser diode device on such an external heat sink comprise a material having a high thermal conductivity, for example, a metal, e.g., copper or aluminum, or a ceramic material, e.g., AlN. Furthermore, at least the mounting part can also comprise a composite material and can be formed, for example, by a metal-core circuit board having a metal layer enveloped by a plastic material. Furthermore, the mounting part, for making electrical contact with the laser diode chip, can have an electrical lead, for example, in the form of a conductor track, and a soldering area. If the mounting part is formed by a main body composed of metal on the side facing the laser diode chip, the electrical lead can be made possible by the main body itself.

In accordance with a further embodiment, the housing has a housing cover, which is applied above the mounting part and closes the housing. The housing cover furthermore has a window, through which the light emitted by the laser diode chip during operation can be emitted from the laser diode device. The housing cover can comprise, for example, a metal such as, for instance, steel, in particular high-grade steel, or else a ceramic material or be composed thereof, apart from the window. Particularly preferably, a hermetically impermeable closure of the housing can be made possible by the housing cover. By way of example, the housing cover can be welded to the mounting part or a further housing part.

In accordance with a further embodiment, the housing has a housing part connected to the mounting part. The mounting part can extend away from the housing part along an extension direction. In other words, the mounting part can project away from the housing part and can be embodied in a pin-type fashion, for example. In this case, the mounting part preferably has a mounting area, which extends away from the housing part along the extension direction of the mounting part and on which the laser diode chip is arranged.

The housing part can be provided and designed, in particular, for making it possible to arrange a housing cover for closing the housing on the housing part. The housing part and the mounting part, which, in particular, can also be embodied integrally with one another, preferably each have a main body composed of copper or, in the case of integral embodiment, a common main body composed of copper. As an alternative thereto, the main body can also comprise some other material from among those mentioned above.

At least the housing part can furthermore be steel-sheathed. That means that the housing part is substantially formed from the main body and is covered with a steel layer. The steel layer can be formed, for example, by a layer composed of high-grade steel. A steel sheathing of the housing part can be particularly advantageous since it is thereby possible, as in the case of a standard TO housing having a steel base, for a housing cover to be welded to the housing part. In this case, the mounting part projects into the housing cover from the housing part along its extension direction, such that the laser diode chip, with the housing cover mounted, is situated on the mounting part in the cavity formed by the housing cover and the housing part.

In accordance with a further embodiment, in addition to the housing part, the mounting part is also steel-sheathed. In particular, the housing part and the mounting part in this embodiment can have a common copper main body covered with a steel layer.

Particularly preferably, the housing can be embodied as a so-called TO housing, for example, having a structural size TO38, TO56 or TO90. In this embodiment, the housing part can also be designated as "base plate" and the mounting part as "stem." In comparison with standard TO housings which are usually used and which have at least one housing part or a housing part and a mounting part which substantially consist of steel and do not have a copper-based main body, the housing in this embodiment has a higher thermal conductivity on account of the copper of the steel-sheathed housing part.

In accordance with a further embodiment, the mounting part or else, if appropriate, a housing part can have holes or openings, for example, through which electrical leads, for example, in the form of contact legs, can project from that side of the housing which faces away from the mounting part to the side on which the mounting part is arranged. The electrical leads can be provided for making electrical contact with the laser diode chip, for example, via a wire connection between an electrical lead and the laser diode chip.

In accordance with a further embodiment, the laser diode chip is based on a nitride compound semiconductor material. The laser diode chip can have, in particular, a substrate, preferably an electrically conducting substrate, for example, crystalline (In,Al,Ga)N. Thereabove, it is possible to apply an epitaxial layer sequence, that is to say epitaxially grown semiconductor layers, which is based on a nitride compound semiconductor material and is thus embodied on the basis of InAlGaN.

Designations such as "InAlGaN-based compound semiconductor materials," "(In,Al,Ga)N-based compound semiconductor materials" and "nitride compound semiconductor materials" include, in particular, those semiconductor materials which comprise a material from the III-V compound semiconductor material system $In_xAl_yGa_{1-x-y}N$ where $0 \leq x \leq 1$, $0 \leq y \leq 1$ and $x+y \leq 1$, that is to say, for example, GaN, AlN, AlGaN, InGaN, AlInGaN. The laser diode chip can have, in particular, on the substrate a semiconductor layer sequence having an active layer, particularly, on the basis of AlGaInN and/or InGaN, which is provided for emitting light during operation. In particular, the laser diode chip can emit light from an ultraviolet to green wavelength range during operation.

In accordance with a further embodiment, the laser diode chip has semiconductor layers on the substrate, said semiconductor layers having, for example, the active layer between waveguide layers and cladding layers. In particular, it is possible to apply on the substrate a first cladding layer, thereabove a first waveguide layer, thereabove the active layer, thereabove a second waveguide layer and above the latter a second cladding layer. Above the second cladding layer, it is furthermore possible to arrange a semiconductor contact layer and, above the latter, an electrical connection layer, for example, in the form of a metal layer. Electrical contact can be made with the laser diode chip particularly preferably via the electrical connection layer situated opposite the substrate and also via the conductive substrate, wherein the substrate can also have an electrical connection layer on the side facing away from the semiconductor layers. In this case, the laser diode chip can be mounted on the mounting part directly with the substrate or with an electrical connection layer on the side of the substrate facing away from the semiconductor layers. On that side of the active layer which faces away from the substrate, a charge carrier barrier layer can furthermore be arranged between the waveguide layer and the cladding layer in order to avoid a so-called charge carrier overshoot.

By way of example, the semiconductor layers arranged between the substrate and the active layer can be n-doped and the semiconductor layers arranged above the active layer as seen from the substrate can be p-doped. As an alternative thereto, it is also possible to reverse the doping order. The active layer can be undoped or n-doped. The laser diode chip can have as active layer, for example, a conventional pn junction, a double heterostructure or a quantum well structure, particularly preferably a multi quantum well structure (MQW structure). In the context of this application, the designation quantum well structure encompasses, in particular, any structure in which charge carriers can experience a quantization of their energy states as a result of confinement. In particular, a quantum well structure can have quantum wells, quantum wires and/or quantum dots and a combination of these structures. By way of example, the active layer can have InGaN-based quantum films between suitably embodied barrier layers.

In accordance with one particularly preferred embodiment, for producing the laser diode chip, as described above, firstly n-doped layers, then the active region and thereabove a p-doped layer are grown.

In accordance with a further particularly preferred embodiment, the laser diode chip is arranged with the substrate on the mounting part, such that the laser diode chip has the preferably epitaxially deposited semiconductor layers on that side of the substrate which faces away from the mounting part and the solder layer. This preferred mounting direction is also designated hereinafter as "Epi up."

In accordance with a further embodiment, the laser diode chip has a radiation coupling-out area with a radiation coupling-out region, via which the light generated in the active layer is emitted during operation. The radiation coupling-out region is typically defined by one on the basis of internal waveguiding effects and a current density distribution chosen in a targeted manner on the radiation coupling-out area. In this case, the laser diode chip is preferably embodied as an edge emitting laser diode chip, in which the radiation coupling-out area can be produced, for example, by breaking, cleaving and/or etching a semiconductor layer composite assemblage along a crystal plane. Furthermore, the laser diode chip has a rear side area arranged opposite the radiation coupling-out area. The radiation coupling-out area and the rear side area are usually also designated as so-called facets in the case of edge emitting laser diode chips. Furthermore, the laser diode chip has side areas which connect the rear side area and the radiation coupling-out areas to one another and which are formed by the sides of the semiconductor layers which delimit the latter in a direction perpendicular to the growth and arrangement direction of the semiconductor layers.

Here and hereinafter, the outer area of the laser diode chip which faces the mounting part and is in direct contact with the solder layer is also designated as underside, while the outer area situated opposite the mounting part in the layer arrangement direction is designated as top side.

In accordance with a further embodiment, the laser diode chip is arranged directly on the mounting part by means of the solder layer and is thus mounted directly on the mounting part. That means, in particular, that only the solder layer is arranged between the laser diode chip and the mounting part. The solder layer has a thickness of greater than or equal to 3 µm. Particularly preferably, the thickness of the solder layer can also be greater than or equal to 4 µm and furthermore also greater than or equal to 5 µm.

In accordance with a further embodiment, the solder layer comprises a soft solder and is preferably composed of a soft solder. In particular, the soft solder can be formed of an alloy comprising one or a plurality of metals selected from Sn, In and Au, for example:

AuSn, particularly preferably comprising 80% Au and 20% Sn,
AuGe, particularly preferably comprising 88% Au and 12% Ge,
SnPb, particularly preferably comprising 63% Sn and 37% Pb,
SnAg, particularly preferably comprising 96.5% Sn and 3.5% Ag or 95% Sn and 5% Ag or 80% Sn and 20% Ag,
SnPbAg, particularly preferably comprising 63% Sn, 35.6% Pb and 1.4% Ag,
SnIn, particularly preferably comprising 95% Sn and 5% In,
InAg, particularly preferably comprising 90% In and 10% Ag,
SnInAg, particularly preferably comprising 77% Sn, 21.2% In and 2.8% Ag,
SnCu, particularly preferably comprising 99% Sn and 1% Cu or 99.3% Sn and 0.7% Cu,
SnAgCu, particularly preferably comprising 95.5% Sn, 3.8% Ag and 0.7% Cu,
SnSb, particularly preferably comprising 95% Sn and 5% Sb,
SnAgSb, particularly preferably comprising 65% Sn, 25% Ag and 10% Sb,
SnBi, particularly preferably comprising 58% Bi and 42% Sn,
SnBiCu, particularly preferably comprising 90% Sn, 9.5% Bi and 0.5% Cu or 95% Sn, 3.5% Bi and 1.5% Cu or 95% Sn, 3% Bi and 2% Cu,
SnBiInAg, particularly preferably comprising 78% Sn, 10% Bi, 10% In and 2% Ag.

In accordance with one particularly preferred embodiment, the laser diode device comprises a housing with a mounting part, on which a laser diode chip based on a nitride compound semiconductor material is mounted in the housing directly by means of a solder layer and the solder layer has a thickness of greater than or equal to 3 µm.

The fact that the laser diode chip is mounted directly on the mounting part of the housing by means of the solder layer means, in particular, that in the case of the laser diode device described here, no additional heat sink such as is customary in the prior art is arranged between the laser diode chip and the housing, which heat sink might function as a heat spreader. Such a manner of mounting laser diode chips in which an additional heat sink is used between the laser diode chip and the housing corresponds to the prior art. The additional heat sink below the laser diode chip is usually a mounting body having good thermal conductivity for the purpose of heat spreading and having a thickness of more than 10 µm and typically, for example, 50 to 120 µm. This manner of mounting was optimized in particular for infrared and red lasers, particularly those based on arsenides, and heretofore has been transferred to the mounting of nitride-based laser diode chips without significant modifications. In the case of the laser diode device described here, the contribution of the heat sink to the total thermal resistance is thus omitted. A 200 µm thick AlN heat sink, such as is likewise typically used in the prior art, has a thermal resistance of approximately 3 to 4 K/W.

In the case of infrared and red lasers which are based on arsenidic compound semiconductor materials and are usually mounted "Epi down" owing to their substrate having poor thermal conductivity, if an additional heat sink were dispensed with there would be a high risk of the active region being short-circuited by solder at the chip edges, or else of solder migrating at the chip edges during operation and producing such short circuits. Moreover dispensing with the heat sink would give rise to high strains and crystal defects in the laser diode chip during operation, so-called "dark line defects," which arise during cooling after soldering on account of the different coefficients of thermal expansion of the chip and of the housing and which can lead to the failure of the component. Although this risk can be reduced somewhat by the use of very soft solders, it is still too high. Soft solders such as In based alloys furthermore tend to migrate and can thereby easily bring about short circuits above the active region of a laser diode chip.

The inventors have recognized that, contrary to the previous assumptions and procedures, such problems do not apply to laser diode chips based on a nitride compound semiconductor material. By way of example, it is possible to use substrates having a thermal conductivity of approximately 200 W/mK instead of 46 W/mK in the case of GaAs substrates. As a result, laser diode chips based on nitride compound semiconductor material can also be mounted "Epi up," such that there is no increased risk of short circuits in the case of a preferred substrate thickness of greater than or equal to 50 µm and less than or equal to 150 µm, preferably, for example, a thickness of approximately 110 µm. "Dark line defects" are not known for nitride-based laser diode chips and therefore do not constitute a problem.

For a high quality of the mounting of the laser diode chip on the mounting part of the housing without an additional heat sink therebetween, the solder layer described here having a thickness of greater than or equal to 3 µm is particularly advantageous, while a solder layer that is as thin as possible is preferred for thermal reasons in the prior art. In particular, a soft solder described above is suitable for compensating for thermal strains during cooling after the soldering of the laser diode chip and for unevennesses of the mounting part. Such unevennesses may be virtually unavoidable, for example, if a mounting part based on copper with a steel sheathing is used. The use of the thick solder layer described here thus affords thermal advantages in total since a soldering that is homogeneous and in particular free of shrink holes, such as is possible by virtue of the thickness of the solder layer as described here, outweighs the inherently greater thermal resistance caused by the thickness of the solder layer as described here in comparison with a thin solder layer. In particular, even though the heat sink that is usually used in the prior art is omitted, it is possible overall to achieve a reduction of the thermal resistance between the laser diode chip and the housing, wherein, for thermally linking the laser diode chip to the thick solder layer as continuously as possible and over the largest possible area, the anchoring elements described further below can furthermore particularly preferably be provided in the laser diode chip. In the case of the laser diode device described here, heat spreading can also be effected in this case by means of the housing and in particular the mounting part.

In particular, for the laser diode device described here, a significant increase in the output power, in comparison with the prior art, to more than 3 W is possible. However, such an increase is possible only through the combination of a housing having the best possible thermal conductivity, such as a copper-based housing, for example, with the thick solder layer, since, by way of example, although just the use of such a thermally optimized housing can decrease the thermal resistance by approximately 2 to 3 K/W, this is insufficient for achieving an output power of more than 3 W.

Externally, however, the laser diode device described here can advantageously correspond totally to the components produced heretofore according to the prior art and it can be produced with comparable processes suitable for mass production. The costs measured, for instance, in dollars per watt can thus be significantly reduced. Furthermore, fewer components are necessary for an identical light power in an application with the use of the laser diode device described here in comparison with known laser diodes.

In the case of customary laser diodes in which laser diode chips are mounted on a housing via an additional heat sink, the heat sink is able not only to act as a heat spreader but also to reduce strains which act on the chip, since the housing usually has a coefficient of thermal expansion that is far above the coefficient of thermal expansion of the chip. Such compensation of strain by means of an additional heat sink is not possible in the case of the laser diode device described here. If the coefficients of thermal expansion differ excessively between the laser diode chip and the housing, it can happen during cooling to room temperature after the soldering of the laser diode chip that the housing contracts to a greater extent than the laser diode chip. As a result, it can happen that the laser diode chip forms a convex curvature facing away from the housing. Consequently, chip shearing can occur, because of which the laser diode chip is no longer soldered on optimally and over the whole area. Therefore, the laser diode chip has a strain that endeavors to convexly deform the underside of the laser diode chip facing the mounting part, or that counteracts at least a concave deformation of the underside of the laser diode chip facing the mounting part. By way of example, the laser diode chip can be embodied in such a way that, in an un-mounted state, it has a bowl-shaped curvature or at least a minimal bowl shape with a virtually planar embodiment. A suitable strain of the laser diode chip can be set, for example, by means of growth conditions chosen in a targeted manner during the growth of the semiconductor layers on the substrate.

In accordance with a further embodiment, the laser diode chip has, in the underside facing the mounting part, at least one anchoring element for the solder of the solder layer. The anchoring element can be formed, for example, by a depression or an elevation in the underside of the laser diode chip facing the mounting part. Preferably, the laser diode chip has a plurality of anchoring elements, which can be shaped and/or arranged regularly or irregularly. One or a plurality of anchoring elements can for example also be formed in a manner adjoining side areas of the laser diode chip, that is to say at chip edges between the underside of the laser diode chip facing the solder layer and the radiation coupling-out area and/or the rear side area and/or one or a plurality of side areas, in each case as a stepped depression. By means of the anchoring elements, it is possible to achieve an interlinking of the solder and of the laser diode chip which can counteract chip shearing in addition or as an alternative to an above-described targeted strain of the laser diode chip. In the preferred "Epi up" mounting described above, the at least one and preferably the plurality of anchoring elements are formed in the substrate.

The at least one and preferably the plurality of anchoring elements can be introduced, for example, in a targeted manner as discrete elevations or depressions. The anchoring elements can have, in particular, punctiform elevations and/or depressions or else linear elevations and/or depressions. By way of example, anchoring elements can also be formed by a targeted roughening or a targeted mechanical or chemical removal. Furthermore, it is also possible for an anchoring element to be provided, for example, in the form of a step in the region of the substrate edge at one or both facets, that is to say the radiation coupling-out area and/or the rear side area.

In order to produce the at least one anchoring element and preferably the plurality of anchoring elements, it is possible preferably to carry out dry- or wet-chemical etching, in particular anisotropic etching methods, lithographic patternings and/or mechanical patternings.

Preferably, the at least one and preferably the plurality of anchoring elements has a depth of greater than or equal to 0.1 µm and less than or equal to 10 µm and preferably of greater than or equal to 0.5 µm and less than or equal to 5 µm. A size of greater than or equal to 0.1 µm and preferably greater than or equal to 0.5 µm is particularly suitable such that a sufficient interlinking between the laser diode chip and the solder arises, while a depth of less than or equal to 10 µm and preferably of less than or equal to 5 µm is particularly suitable for achieving a complete filling or enclosing of an anchoring element with the solder and thus a linking of the laser diode chip to the solder layer over the largest possible area.

In accordance with a further embodiment, the laser diode chip has a metallization on the side areas and/or the radiation coupling-out area and/or the rear side area. The metallization can be embodied, in particular, in the form of a metal layer. The metallization is thus embodied in particular in a layered fashion with a main extension plane that is parallel to the arrangement direction of the semiconductor layer sequences of the laser diode chip. By means of such a metallization, a cooling of the laser diode chip can be achieved via the areas of the laser diode chip that are provided with the metallization. By way of example, the metallization can be arranged directly on the substrate and at least some semiconductor layers. Particularly preferably, the metallization is in this case arranged, as seen from the mounting part, below the active layer, that is to say—in the case of "Epi up" mounting described above—on side areas of the substrate and side areas of those semiconductor layers which are arranged between the substrate and the active layer. This makes it possible to prevent the metallization from causing a short circuit by a bridging of the n- and p-doped layers above and below the active layer. Effective heat dissipation can be made possible on account of such a direct contact of the metallization with the semiconductor material of the laser diode chip.

If the metallization is arranged on the radiation coupling-out area and/or the rear side area directly in contact with the semiconductor layers, then the metallization is preferably situated between the semiconductor layers and an optical layer on the radiation coupling-out area and/or the rear side area. The optical layer is formed, in particular, by the facet reflective coating or antireflective coating that is customary for laser diode chips. Usually, the optical layer on the radiation coupling-out area and the rear side area is formed from a dielectric material or a dielectric layer sequence. If a metallization is provided on the radiation coupling-out area, then the radiation coupling-out region remains free of the metallization, such that the light generated in the active layer can be emitted without being impeded.

Furthermore, it is also possible for a metallization to form an outer side of the laser diode chip. In other words, the metallization is not covered by a further layer of the laser diode chip. In the case where the metallization is arranged on the side areas, the metallization can both be applied directly on the semiconductor layers and form outer sides of the laser diode chip. If the metallization is arranged on the radiation coupling-out area and/or the rear side area and forms an outer side of the laser diode chip, then this means, in other words, that the metallization is arranged on the optical layer of the radiation coupling-out area or the rear side area. In particular, the metallization can extend as far as the underside of the laser diode chip. What can be achieved by means of a metallization that forms an outer side of the laser diode chip is that the solder of the solder layer can wet the metallization. As a result, a part of the solder layer can "run up" to the metallization in a targeted manner and thus make possible a good thermal contact and hence a good heat dissipation of the laser diode chip via the areas of the laser diode chip that are provided with the metallization.

The metallization can comprise, in particular, one or more of the metals Au, Ti, Pt, Cr, Pd, Ni, Ag, W, Cu.

In accordance with a further embodiment, the laser diode chip has, on a top side facing away from the mounting part, at least one depression which extends from the rear side area to the radiation coupling-out area and which is covered with a passivation. In particular, the depression projects into the semiconductor layer sequences to above the active layer as seen from the top side. Preferably, the laser diode chip has two depressions which in each case extend from the radiation coupling-out area to the rear side area and between which a contact region is arranged on the top side, via which contact region a targeted current impression or current density distribution in the laser diode chip, and in particular in the active layer, is produced. Consequently, the depressions with the passivation are preferably situated between possible migration paths of the solder along which the solder could move from a metallization on the side areas of the laser diode chip toward the contact region. It is thereby possible to prevent the solder from running up in an uncontrolled manner at the chip edges, or to prevent an uncontrolled migration of solder in the region of the laser diode device, which would cause a short-circuiting of the active layer. The depressions can also be designated as so-called mesa trenches that interrupt the active layer.

Since, in comparison with laser diodes in the prior art, a significant reduction of the thermal resistance can be achieved by means of the configuration of the laser diode device as described here, it is possible to operate laser diode chips with a larger active area, that is to say a larger energized area, in comparison with the prior art. In the laser diode device described here, therefore, it is possible to use laser diode chips having a longer and/or wider energized area in comparison with the prior art. In particular, the active layer can have an area of greater than or equal to 2,500 $\mu m^2$, preferably of greater than or equal to 10,000 $\mu m^2$ and particularly preferably of greater than or equal to 20,000 $\mu m^2$ up to 30,000 $\mu m^2$. In this case, a decrease in the current density from a maximum value to 10% is assumed as area delimitation.

Furthermore, in the case of the laser diode device described here, it is also possible, unlike in the prior art, without further outlay, to use more than one laser diode chip in one of the housings described here, whereby an increase in the output power can likewise be achieved.

BRIEF DESCRIPTION OF THE DRAWINGS

Further advantages, advantageous embodiments and developments will become apparent from the exemplary embodiments described below in conjunction with the Figures.

In the Figures.

In the exemplary embodiments and figures, elements that are identical, of identical type or act identically may in each case be provided with the same reference signs. The illustrated elements and their size relationships among one another should not be regarded as true to scale; rather, individual elements such as, for example, layers, structural parts, components and regions may be illustrated with an exaggerated size in order to enable better illustration and/or in order to afford a better understanding.

DETAILED DESCRIPTION OF ILLUSTRATIVE EMBODIMENTS

Figure 1A:
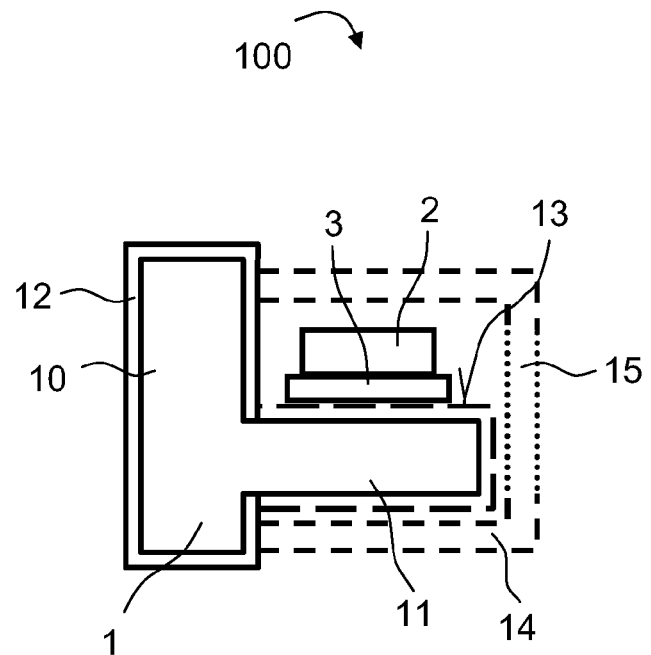
FIGS. 1A and 1B show schematic illustrations of a laser diode device in accordance with an exemplary embodiment.
Figure 1B:
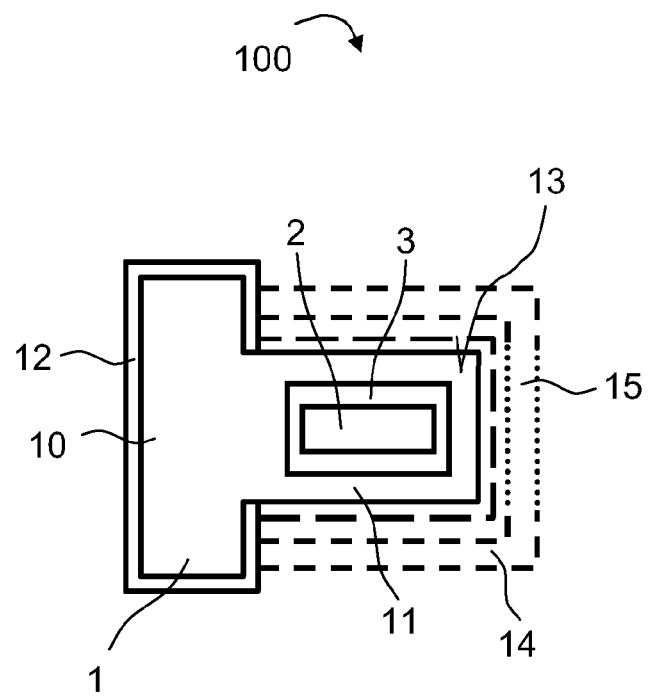

FIGS. 1A and 1B show an exemplary embodiment of a laser diode device 100, wherein FIG. 1A shows a schematic sectional illustration and FIG. 1B a plan view of the laser diode device 100. The following description relates equally to FIGS. 1A and 1B.

The laser diode device 100 comprises a housing 1, in which a laser diode chip 2 is mounted on a mounting part 11 by means of a solder layer 3.

The housing 1 has the highest possible thermal conductivity and is embodied in the form of a so-called TO housing in the exemplary embodiment shown. In this case, the housing 1 has a housing part 10 and the mounting part 11 arranged at the housing part. The mounting part 11 extends away from the housing part 10 and is embodied integrally with the housing part 10 in the exemplary embodiment shown. For this purpose, the housing part 10 and the mounting part 11 have a main body formed from a metal, which is copper in the exemplary embodiment shown.

The housing part 10 furthermore has a sheathing 12 composed of steel, which is formed by a coating of the copper main body in the region of the housing part 10. The mounting part 11 can be formed by an uncoated main body, that is to say by the copper main body in the exemplary embodiment shown, or, as is indicated by the dashed line around the mounting part 11, can likewise have a sheathing, preferably a steel sheathing.

Furthermore, the housing part 10 can have holes or openings, for example, in which are arranged small lead legs projecting from that side of the housing part 10 which faces away from the mounting part 11 to the side of the mounting part 11. Small lead legs arranged and fixed therein can be embodied as electrical feed-throughs, for example, and afford possibilities for electrical contact-making.

A housing cover 14 is preferably arranged above the mounting part 11 and thus above the laser diode chip 2, as is indicated by the dashed lines. The housing cover 14, which can furthermore have a window 15, can comprise steel, for example, and preferably be composed of steel, apart from the window 15. By virtue of the fact that the housing part 10 has the steel sheathing 12 in the exemplary embodiment shown here, the housing cover 14 can be applied on the housing part 10 of the housing 1 and, as in customary TO housings having steel bases, can be fixed by means of welding in a standard process.

As an alternative to the housing 1 of TO design shown here, the housing 1 can also be embodied differently therefrom. By way of example, the housing 1 can have a mounting part 11 composed of ceramic or a metal, on which a housing cover is arranged directly or on additional side parts. Furthermore, the mounting part 11 can for example also be formed by a metal-core circuit board. Independently of the geometrical and material-specific configuration of the housing 1, the latter preferably has the highest possible thermal conductivity.

The mounting part 11 has a mounting area 13, on which a laser diode chip 2 is arranged. In particular, the laser diode chip 2 is mounted directly on the mounting area 13 of the mounting part 11 by means of the solder layer 3 and is thereby electrically and thermally connected to the housing 1. Consequently, only the solder layer 3 is arranged between the laser diode chip 2 and the mounting part 11.

The solder layer 3 has a thickness of greater than or equal to 3 μm and is formed by a soft solder, in particular a soft solder based on one or a plurality of metals selected from Sn, In and Au. In particular, the solder layer can be formed by one of the solder materials mentioned above in the general part.

While it is customary for the purpose of optimum heat dissipation in standard laser diode components to couple a laser diode chip to a housing via a solder layer that is as thin as possible, in order to obtain a thermal resistance that is as low as possible, the solder layer 3 of the laser diode 100 described here has a thickness of greater than or equal to 3 μm. The thickness of the first solder layer 3 can also be greater than or equal to 4 μm or even greater than or equal to 5 μm. It is thereby possible to compensate for thermally induced stresses that occur during operation as a result of the heat generated in the laser chip 2 or the cooling effected after the soldering of the laser diode chip 2 and the different coefficients of thermal expansion of the laser diode chip 2 and of the housing 1. Furthermore, by way of example, surface unevennesses on the mounting area 13 of the mounting part 11 can also be compensated for by such a thick solder layer. Said unevennesses can occur in particular when the mounting part 11 has the copper main body shown here and a sheathing composed of steel.

Figure 2:
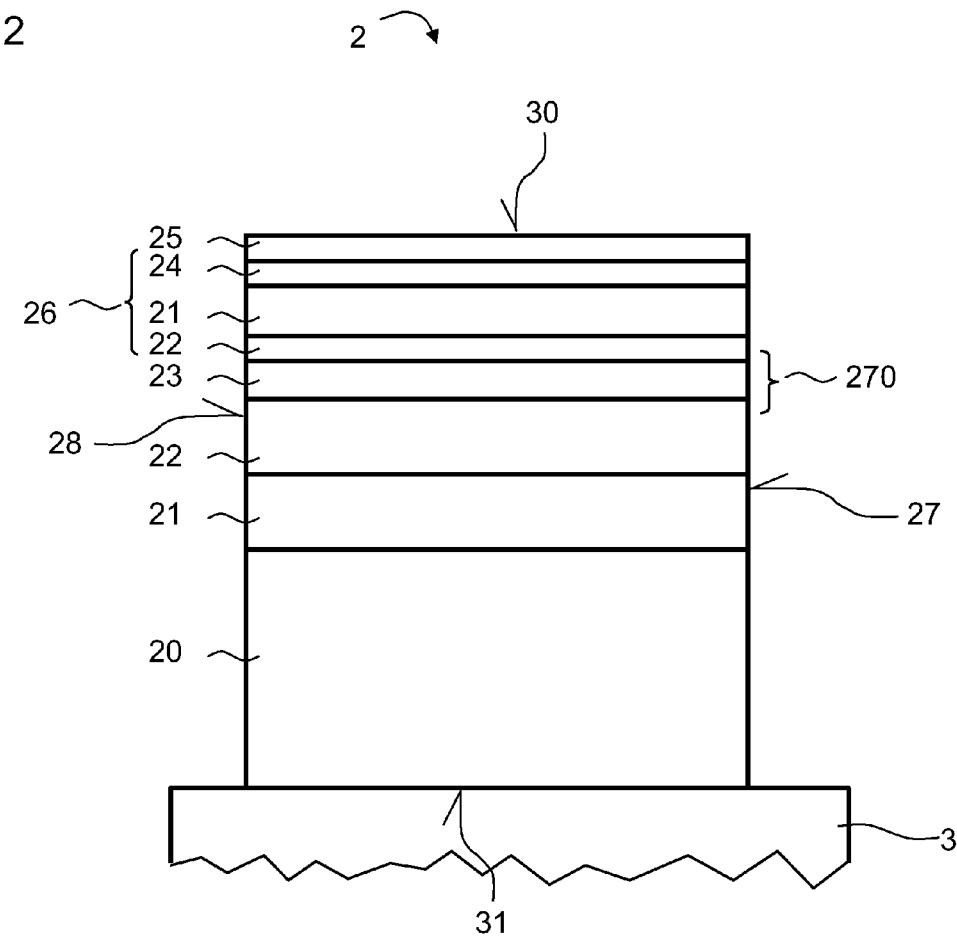
FIG. 2 shows a schematic illustration of a laser diode chip in accordance with a further exemplary embodiment.

Preferably, as is shown in FIG. 2 in accordance with one preferred exemplary embodiment, the laser diode chip 2 is embodied as an edge emitting laser diode chip having a radiation coupling-out area 27 formed by a side area and a rear side area 28 situated opposite the radiation coupling-out area. The radiation coupling-out area 27 has a radiation coupling-out region 270, via which the laser radiation generated in the laser diode chip 2 is emitted during operation. Furthermore, the laser diode chip 2 has side areas which connect the radiation coupling-out area 27 and the rear side area 28 to one another. Preferably, on the radiation coupling-out area 27 and the rear side area 28 there are applied optical layers (not shown) which form reflective and/or antireflective layers and by means of which a resonator having the desired reflection and coupling-out properties is formed.

In particular, the laser diode chip 2 is based on a nitride compound semiconductor material. For this purpose, the laser diode chip 2 has a substrate 20, which is preferably embodied as electrically conducting and, for example, comprises crystalline (In, Al, Ga)N or is composed thereof. A semiconductor layer sequence based on a nitride compound semiconductor material is grown thereabove, preferably by means of an epitaxy method such as, for example, metal organic vapor phase epitaxy (MOVPE). The laser diode chip 2 has, on the substrate 20, an active layer 23 arranged between waveguide layers 22 and cladding layers 21. In particular, the laser diode chip 2 has a first cladding layer 21 on the substrate 20 on which the first cladding layer 21, a first waveguide layer 22 and thereabove the active layer 23 are arranged. Above the active layer 23 there follow in the growth direction a further waveguide layer 22 and also a further cladding layer 21 and thereabove a semiconductor contact layer 24, with which contact is made by an electrical connection layer 25, for example, in the form of a metallic electrode layer. The laser diode chip 2 is electrically connected via the electrical connection layer 25 and the electrically conducting substrate 20, which can have a further electrical connection layer (not shown) on the side facing away from the semiconductor layers 21, 22, 23 and 24. The electrical connection layer 25 can be in electrical contact only with a partial region of the semiconductor contact layer 24, for example, formed using a patterning step, in order to achieve a current impression into a region of the active layer 23 chosen in a targeted manner.

The arrangement direction of the laser diode chip 2 with the substrate 20 directly on the solder layer 3 as shown is also designated as "Epi up."

In the exemplary embodiment shown, as seen from the active layer 23, the semiconductor layers facing the substrate 20 are n-doped, while the semiconductor layers designated by the reference sign 26 and arranged on that side of the active layer 23 which faces away from the substrate 20 are p-doped. The active layer 23 can be n-doped or undoped, for example, and can have a multi quantum well structure, in particular, in the exemplary embodiment shown.

Hereinafter, that side of the laser diode chip 2 which is situated opposite the solder layer 3 is designated as the top side 30, and that side of the laser diode chip 2 which faces the solder layer 3 and is directly in contact with the solder layer 3 is designated as the underside 31. The top side can be formed, for example, at least partly by the electrical connection layer 25. If the electrical connection layer 25 is embodied in a patterned fashion, the top side 30 can also be formed partly by an exposed partial region of the semiconductor contact layer 24 and/or, for example, by a passivation layer applied in partial regions on the electrical connection layer 25 and/or the semiconductor contact layer 24.

The material of the mounting part 11, which, as described above, can be formed, for example, by the copper main body or some other material having a high thermal conductivity, usually has a significantly higher coefficient of thermal expansion than the laser diode chip 2. As a result, in particular after the laser diode chip 2 has been soldered onto the mounting part 11 of the housing 1, strains can occur between the laser diode chip 2 and the mounting part 11, which, depending on the choice of solder, can possibly be compensated for only in part by means of the solder layer 3. As a consequence thereof, it could happen that, during cooling after the soldering of the laser diode chip 2, the mounting part 11 contracts to an extent such that the laser diode chip 2 on the solder layer 3 is curved up and has a convex bend on the top side 30 facing away from the mounting part 11. Accordingly, the underside 31 of the laser diode chip 2 facing the mounting part 11 is shaped concavely in this case. The contraction of the mounting part 11 during cooling is indicated by the dashed arrows. If the curvature of the laser diode chip 2 is too great, at least partial chip shearing can occur, that is to say an at least partial detachment of the laser diode chip 2 from the solder layer 3. Particularly preferably, therefore as indicated by the dotted line in FIG. 3, the laser diode chip 2 has a strain which endeavors to convexly deform the underside 31 of the laser diode chip 2 facing the mounting part 11 in an un-mounted state. In other words, the laser diode chip 2 can be produced such that after production it preferably has the bowl-shaped curvature indicated by the dotted line in FIG. 3. The laser diode chip 2 can also be embodied such that it is still slightly bowl-shaped after the cooling of the solder of the solder layer 3. As an alternative thereto, the laser diode chip 2 can also be embodied in a planar fashion or in a virtually planar fashion with a minimal bowl shape and nevertheless have a strain in the semiconductor layers which is suitable for at least partly compensating for the thermal strains that can occur during cooling after the soldering process and which at least partly counteracts a concave deformation of the underside 31 of the laser diode chip 2 facing the mounting part 11.

A corresponding strain of the semiconductor layers of the laser diode chip 2 can be set by means of suitably chosen process parameters during the growth of the semiconductor layers.

Figure 3:
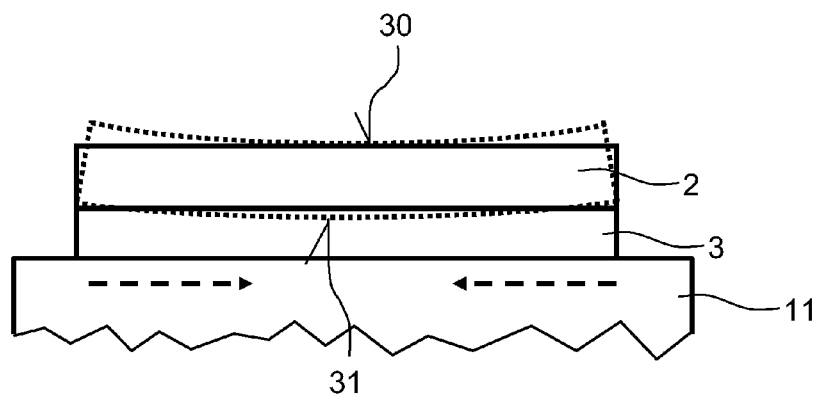
FIG. 3 shows an excerpt from a laser diode device in accordance with a further exemplary embodiment.
Figure 4A:
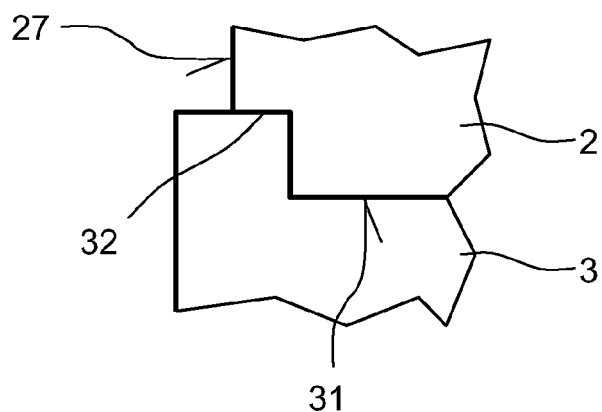
FIGS. 4A to 4C show excerpts from laser diode devices in accordance with further exemplary embodiments.
Figure 4B:
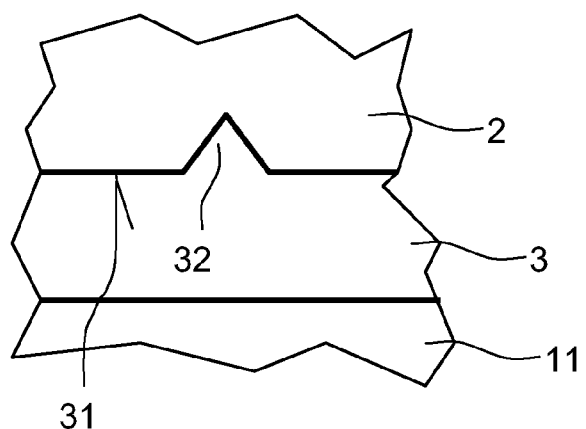
Figure 4C:
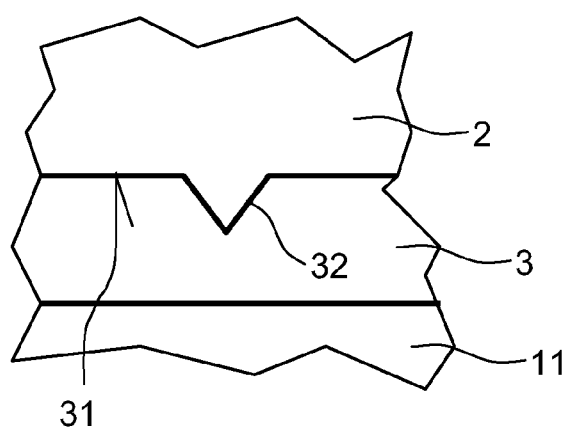

As an alternative or in addition to the strain indicated in FIG. 3, the laser diode chip 2 can also have on the underside 31 at least one anchoring element 32 and preferably a plurality of anchoring elements 32 formed by depressions and/or elevations. FIGS. 4A to 4C show examples of such anchoring elements 32, which in particular can also be present in combinations. A sufficient adhesion of the laser diode chip 2 to the solder layer 3 can be achieved by means of the anchoring elements 32, whereby a large-area thermal connection and, as a result, a reduction of the thermal resistance between the laser diode chip 2 and the housing 1 can be achieved.

In FIG. 4A, the anchoring element 32 is formed by a depression at the chip edge between the radiation coupling-out area 27 and the underside 31, into which the solder of the solder layer 3 can engage. Such an anchoring element 32, which is embodied as a depression and which preferably extends along the chip edge and is embedded in a stepped fashion, can be introduced in a targeted manner in order to achieve an interlinking of the chip edge with the solder of the solder layer 3. Alternatively or additionally, an anchoring element 32 embodied as a stepped depression can also be provided at a chip edge between the underside 31 and the rear side area 28 and/or the underside 31 and a side area 29. Furthermore, a respective anchoring element 32 embodied as a stepped depression can be provided at all chip edges at the underside 31.

FIGS. 4B and 4C show, as anchoring element 32, a depression and an elevation in the underside 31 of the laser diode chip 2. These can be produced by means of a targeted patterning of the underside 31 of the laser diode chip and, for example, can also be embodied in a plurality regularly as discrete punctiform or linear elevations or depressions. Preferably, a multiplicity of anchoring elements 32 in the form of elevations and depressions can also be produced by means of a roughening of the underside 31. In this case, the anchoring elements 32 are arranged in a manner distributed stochastically over the entire underside 31 and can merge into one another.

The anchoring elements 32 in accordance with the exemplary embodiments shown can be produced for example by dry- or wet-chemical etching, in particular anisotropic etching, lithographic patterning and/or mechanical patterning.

The anchoring elements 32 preferably have a size, that is to say a width and/or a depth or height, such that the solder of the solder layer 3 can penetrate into or between the anchoring elements 32. Preferably, for this purpose, the size of the anchoring elements is greater than or equal to 0.1 µm and particularly preferably greater than or equal to 0.5 µm. Furthermore, the anchoring elements 32 have a size which is maximally of a magnitude such that the solder of the solder layer 3 can completely mold around or fill said anchoring elements, such that the solder layer 3 and the underside 31 of the laser diode chip 2 can be linked in a manner free of shrink holes and blisters. For this purpose, the anchoring elements preferably have a size of less than or equal to 10 µm and preferably of less than or equal to 5 µm.

FIGS. 5A to 11 show excerpts from further exemplary embodiments, which can be combined with the abovementioned exemplary embodiments and in which the laser diode chip 2 has a metallization 6 on at least one side area 29, the radiation coupling-out area 27 and/or the rear side area 28. The metallization 6 is formed by one or a plurality of metal layers which preferably comprise or are composed of Au, Ti, Pt, Cr, Pd, Ni, Ag, W, Cu or mixtures or alloys thereof. By means of the metallization, the areas of the laser diode chip 2 which are coated thereby can be additionally cooled, as a result of which more effective heat dissipation can be made possible.

Optical layers 7 in the form of reflective or antireflective layers are shown on the facets, that is to say on the radiation coupling-out area 27 and the rear side area 28, of the laser diode chip 2 described below.

Figure 5A:
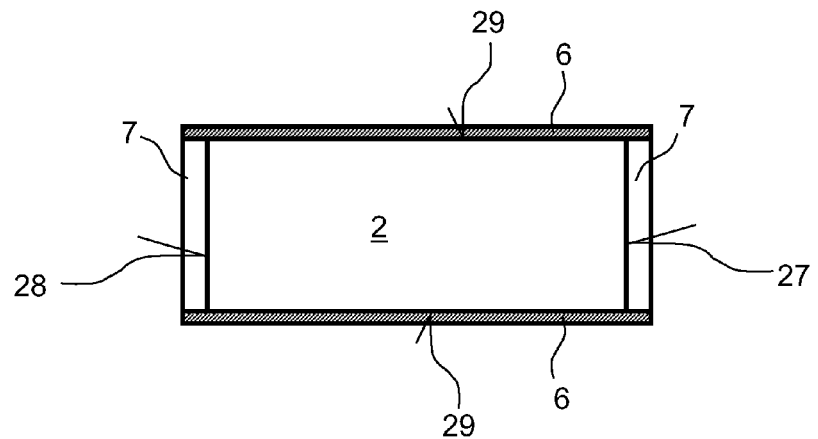
FIGS. 5A to 11 show schematic illustrations of excerpts from laser diode devices in accordance with further exemplary embodiments.
Figure 5B:
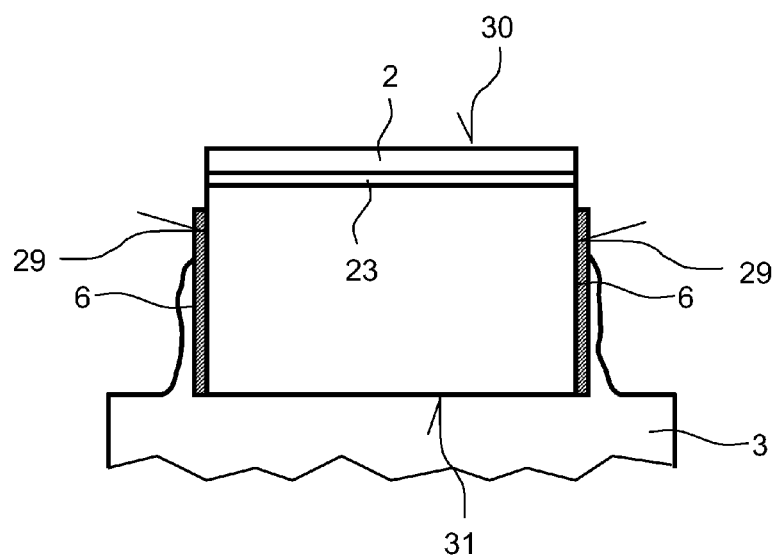

FIGS. 5A and 5B show, in a plan view of the top side and in a sectional illustration parallel to the radiation coupling-out area 27, a laser diode chip 2 having a respective metallization 6 on the side areas 29 which connect the radiation coupling-out area 27 and the rear side area 28 to one another. In this case, the metallization 6 is arranged in direct contact with the substrate and the semiconductor layers of the laser diode chip 2 and simultaneously forms outer areas of the laser diode chip 2. As is evident from FIG. 5B, the metallization 6 is arranged below the active layer 23 as seen from the mounting part 11 or from the underside 31, in order to avoid a short-circuiting of the n- and p-doped sides of the laser diode chip 2. By virtue of the fact that the metallizations 6 form outer sides of the laser diode chip 2, the solder of the solder layer 3 can wet them and climb up them, as is indicated in FIG. 5B. It is thereby possible to achieve a good thermal contact between the side areas 29 of the laser diode chip 2 and the solder layer 3, whereby the side areas 29 can contribute to the heat dissipation of the laser diode chip 2.

Figure 6:
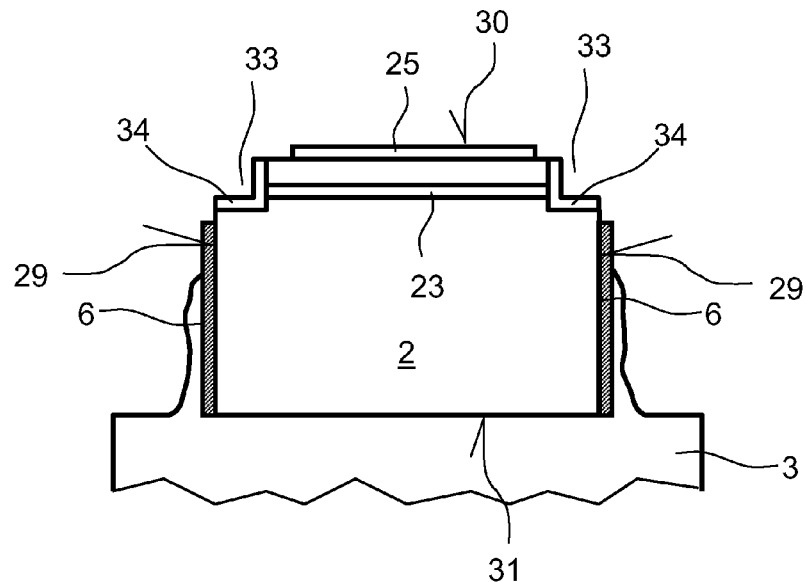
Figure 7:
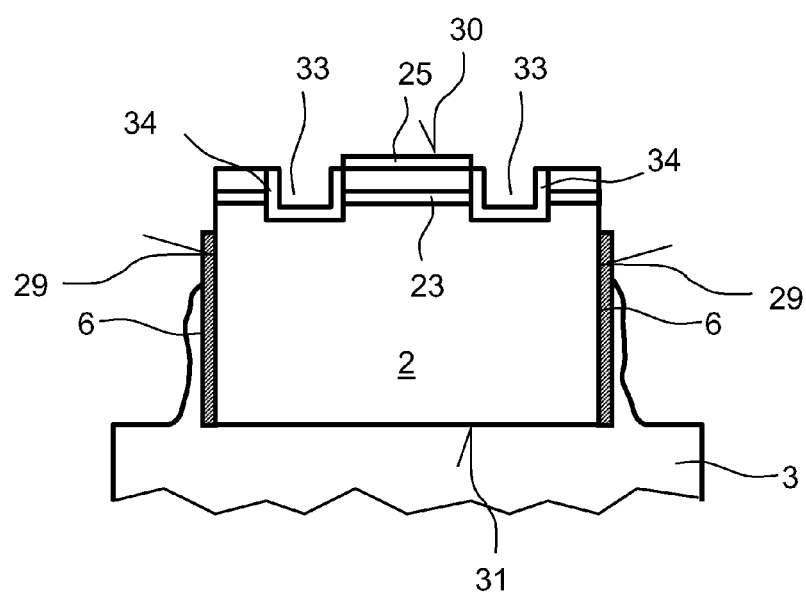

FIGS. 6 and 7 show excerpts from further exemplary embodiments, in which, as in the exemplary embodiment in FIGS. 5A and 5B, metallizations 6 are arranged on the side areas 29. In the case of such an arrangement of the metallization on the side areas, there is an increased risk of short circuits at the side edges, which risk can be caused by the applied metallization 6 and/or by the solder climbing up during the soldering process, since metal particles can migrate to the active layer 23 and, for example, bridge the latter. The laser diode chips 2 in the exemplary embodiments in FIGS. 6 and 7 therefore have depressions 33, which preferably extend from the radiation coupling-out area 27 as far as the rear side area 28 and which are covered with a passivation 34, for example, a dielectric oxide such as $SiO_2$, for instance. The depressions 33 have a depth such that, as seen from the top side 30, they reach as far as below the active layer 23. It is thereby possible to achieve a barrier for solder particles or particles of the metallizations 6, such that these can no longer lead to a short circuit.

As is shown in FIG. 6, the depressions 33 can be formed at the chip edges between the top side 30 and the side areas 29. Furthermore, as is shown in FIG. 7, the depressions 33 can also be drawn further inward in the direction of the energized region of the active layer 23, said region being defined by a patterned electrical connection layer 25. The depressions 33 can also be designated as mesa trenches.

Figure 8:
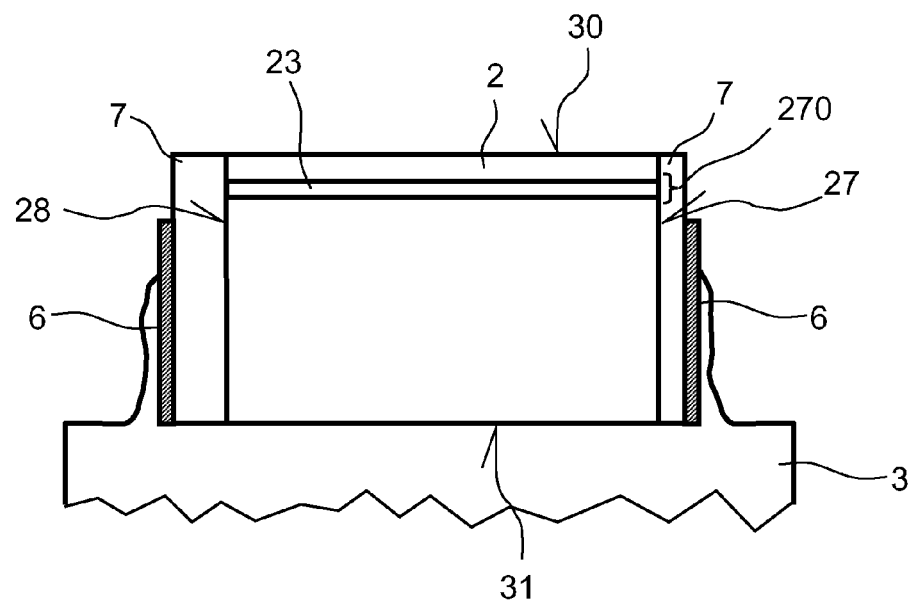

FIG. 8 shows a further exemplary embodiment, in which metallizations 6 are arranged on the optical layers 7 on the radiation coupling-out area 27 and the rear side area 28 and form outer sides of the laser diode chip 2, as a result of which solder of the solder layer 3 can climb up the radiation coupling-out area 27 and the rear side area 28 and can thus lead to a good thermal connection of the facets of the laser diode chip 2 to the solder layer 3 and thus to the housing 1. Particularly, in the case of a metallization 6 on the radiation coupling-out area 27, it is important for the metallization 6, as shown in FIG. 8, to be arranged below the active layer 23 as seen from the underside 31, such that the radiation coupling-out region 270 is free of the metallization 6.

Figure 9:
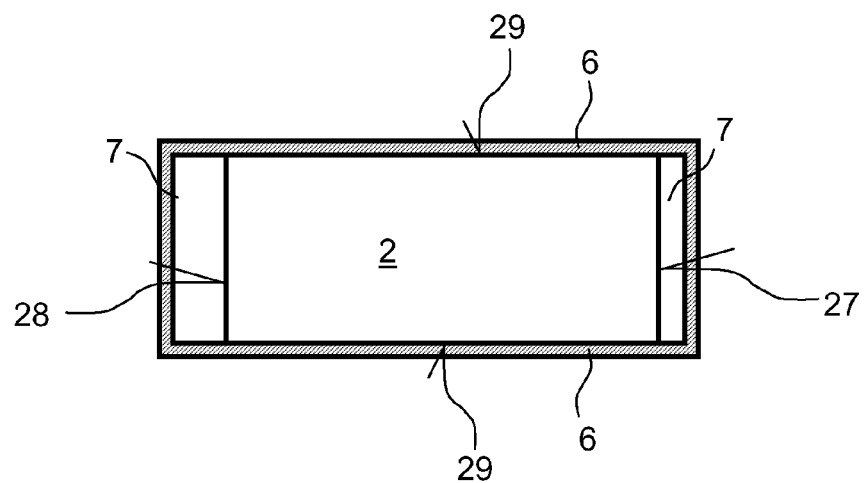

FIG. 9 shows a plan view of a further exemplary embodiment of a laser diode chip 2, in which both the radiation coupling-out area 27, the rear side area 28 and the side areas 29 are provided with a metallization 6, such that the laser diode chip 2 can be thermally connected all around.

Figure 10:
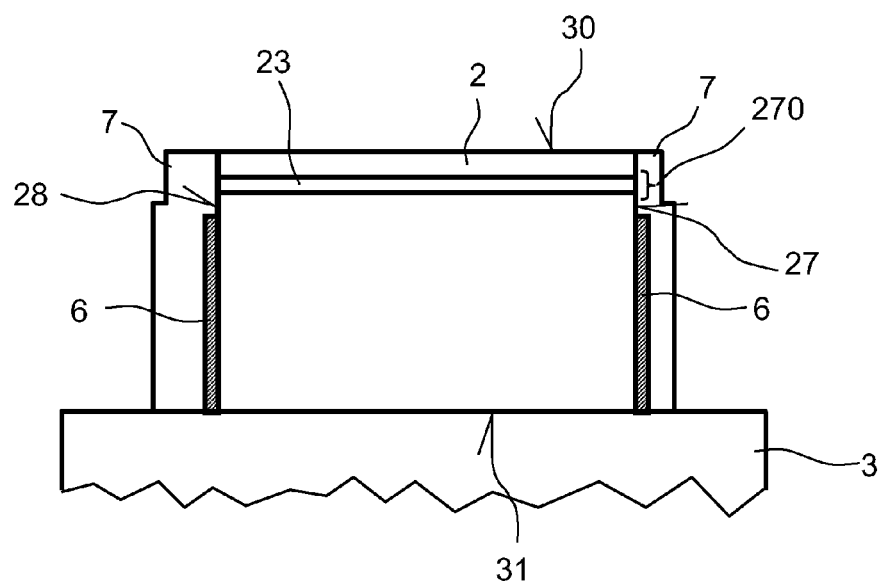

FIG. 10 shows a further exemplary embodiment of a laser diode chip 2, in which, in comparison with the exemplary embodiment in FIG. 8, the metallization 6 is arranged directly on the radiation coupling-out area 27 and the rear side area 28. In other words, the metallization 6 is arranged between the semiconductor layers of the laser diode chip 2 and the optical layers 7 on the radiation coupling-out area and the rear side area 28. As a result, although wetting of the metallization 6 by the solder of the solder layer 3 cannot be achieved, particularly effective heat dissipation of the facets of the laser diode chip 2 can nevertheless be achieved by virtue of the direct contact of the metallization 6 with the radiation coupling-out area 27 and the rear side area 28.

Figure 11:
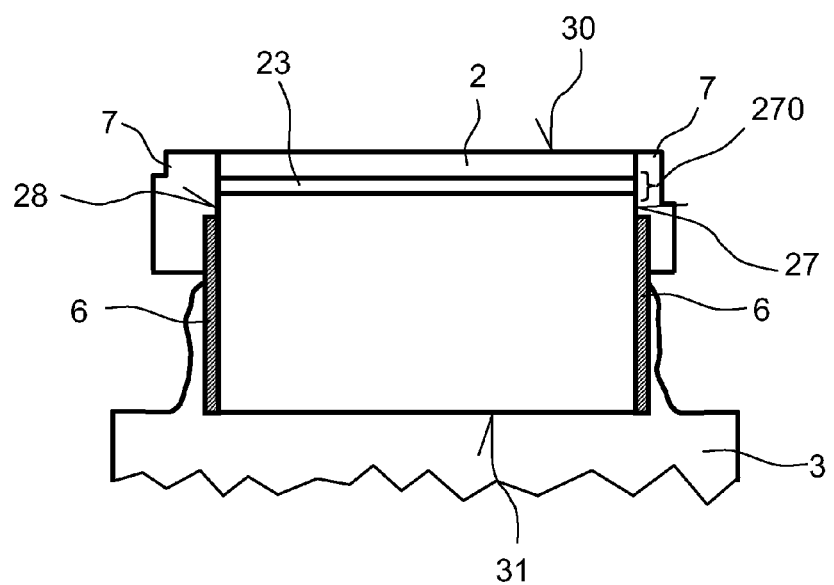

FIG. 11 shows a further exemplary embodiment of a laser diode chip 2, in which, in comparison with the previous exemplary embodiment, the optical layers 7 are only partly applied on the radiation coupling-out area 27 and the rear side area 28 and, in particular, do not reach as far as the solder layer 3, such that a combination of the advantages of the exemplary embodiments in the previous figures can be achieved since the metallization 6 is arranged directly on the facets and at the same time can be wetted by the solder of the solder layer 3.

The features described and shown in the figures and exemplary embodiments can be combined with one another in accordance with further exemplary embodiments, even if such combinations are not explicitly shown or described in the figures. Furthermore, the exemplary embodiments shown in the figures can also have alternative or additional features in accordance with the embodiments in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A laser diode device, comprising:
a housing comprising a mounting part;
a laser diode chip based on a nitride compound semiconductor material disposed on the mounting part, said chip comprising, on a substrate, semiconductor layers with an active layer for generating light and said chip having a radiation coupling-out area with a radiation coupling-out region for emitting the generated light, a rear side area situated opposite the radiation coupling-out area, and side areas connecting the radiation coupling-out area and the rear side area; and
a solder layer disposed between said chip and the mounting part,
wherein the laser diode chip is mounted directly on the mounting part by the solder layer and the solder layer has a thickness of greater than or equal to 3 µm; and
wherein the laser diode chip comprises, in an underside facing the mounting part, at least one anchoring element for the solder layer, said at least one anchoring element being formed by a depression or elevation in the underside and spaced from all edges of said chip.

2. The laser diode device according to claim 1, wherein the substrate is an electrically conducting substrate made of crystalline (In,Al,Ga)N.

3. The laser diode device according to claim 1, wherein the laser diode chip is mounted on the mounting part directly with the substrate or with an electrical connection layer on the side of the substrate facing away from the semiconductor layers.

4. The laser diode device according to claim 1, wherein the mounting part has a metal-core circuit board or a main body composed of metal or composed of ceramic.

5. The laser diode device according to claim 1, wherein the housing has a housing part connected to the mounting part, the housing part and the mounting part have a main body composed of copper, and at least the housing part is steel-sheathed.

6. The laser diode device according to claim 1, wherein the housing has a housing cover above the mounting part, said housing cover closing the housing.

7. The laser diode device according to claim 1, wherein the solder layer is composed of a soft solder.

8. The laser diode device according to claim 1, wherein the laser diode chip has a strain that endeavors to convexly deform the underside of the laser diode chip.

9. The laser diode device according to claim 1, wherein the laser diode chip comprises a strain that counteracts at least a concave deformation of the underside of the laser diode chip.

10. The laser diode device according to claim 1, wherein the laser diode chip comprises a plurality of anchoring elements embodied as elevations and/or depressions in the underside and wherein the at least one anchoring element that is spaced from the edge of said chip is one of said plurality of anchoring elements.

11. The laser diode device according to claim 10, wherein wherein the plurality of anchoring elements further includes a further anchoring element embodied as a stepped depression at a chip edge between the underside and the radiation coupling-out area or the rear side area or a side area.

12. The laser diode device according to claim 1, wherein the laser diode chip comprises a metallization on the side areas.

13. The laser diode device according to claim 12, wherein the metallization forms outer sides of the laser diode chip and the solder of the solder layer wets the metallization.

14. The laser diode device according to claim 12, wherein the metallization comprises at least one or a plurality of metals Au, Ti, Pt, Cr, Pd, Ni, Ag, W, Cu.

15. The laser diode device according to claim 12, wherein the laser diode chip comprises, on a top side facing away from the mounting part, at least one depression which extends from the rear side area to the radiation coupling-out area and which is covered with a passivation.

16. The laser diode device according to claim 1, wherein the laser diode chip comprises a metallization on the radiation coupling-out area and/or the rear side area.

17. The laser diode device according to claim 16, wherein the metallization is arranged directly on the semiconductor layers between the semiconductor layers and an optical layer on the radiation coupling-out area and/or the rear side area.

18. The laser diode device according to claim 16, wherein the metallization forms outer sides of the laser diode chip and the solder of the solder layer wets the metallization.

19. A laser diode device, comprising:
a housing comprising a mounting part;
a laser diode chip based on a nitride compound semiconductor material disposed on the mounting part, said chip comprising, on a substrate, semiconductor layers with an active layer for generating light and said chip having a radiation coupling-out area with a radiation coupling-out region for emitting the generated light, a rear side area situated opposite the radiation coupling-out area, and side areas connecting the radiation coupling-out area and the rear side area; and
a solder layer disposed between said chip and the mounting part,
wherein the laser diode chip is mounted directly on the mounting part by the solder layer and the solder layer has a thickness of greater than or equal to 3 µm,
wherein the substrate is an electrically conducting substrate made of crystalline (In,Al,Ga)N,
wherein the laser diode chip is mounted on the mounting part directly with the substrate or with an electrical connection layer on the side of the substrate facing away from the semiconductor layers; and
wherein the laser diode chip comprises, in an underside facing the mounting part, at least one anchoring element for the solder layer, said at least one anchoring element being formed by a depression or elevation in the underside and spaced from all edges of said chip.

20. The laser diode device according to claim 19, wherein the the at least one anchoring element comprises a plurality of anchoring elements embodied as elevations and/or depressions in the underside.

21. The laser diode device according to claim 19, wherein the the at least one anchoring element comprises a first anchoring element formed by a depression or elevation in the underside and spaced from the edges of said chip and a second anchoring element formed by a stepped depression at a chip edge between the underside and the radiation coupling-out area or the rear side area or a side area.

* * * * *

UNITED STATES PATENT AND TRADEMARK OFFICE
CERTIFICATE OF CORRECTION

PATENT NO. : 9,008,138 B2
APPLICATION NO. : 13/859446
DATED : April 14, 2015
INVENTOR(S) : Uwe Strauss It is certified that error appears in the above-identified patent and that said Letters Patent is hereby corrected as shown below:

In the Claims

Col. 16, line 58, Claim 11, delete "wherein".
Col. 18, line 23, Claim 21, delete "the the" and insert --the--.

Signed and Sealed this
First Day of September, 2015

Michelle K. Lee
*Director of the United States Patent and Trademark Office*